United States Patent [19]

Iizuka

[11] 4,406,051
[45] Sep. 27, 1983

[54] METHOD FOR MANUFACTURING A SEMICONDUCTOR DEVICE

[75] Inventor: Hisakazu Iizuka, Yokohama, Japan

[73] Assignee: Tokyo Shibaura Denki Kabushiki Kaisha, Yokohama, Japan

[21] Appl. No.: 184,883

[22] Filed: Sep. 8, 1980

[30] Foreign Application Priority Data

Sep. 11, 1979 [JP] Japan ............................ 54/115681

[51] Int. Cl.³ .................... H01L 29/04; H01L 27/02
[52] U.S. Cl. .................................. 29/576 B; 29/571; 357/51; 357/59
[58] Field of Search ............... 357/51, 59; 148/174, 148/1-5; 427/86; 29/571, 576 B

[56] References Cited

U.S. PATENT DOCUMENTS

| | | | |
|---|---|---|---|
| 3,460,007 | 8/1969 | Scott, Jr. ............................ | 29/576 |
| 3,570,114 | 3/1971 | Bean et al. ........................ | 29/577 |
| 3,576,478 | 4/1971 | Boyd ................................ | 148/175 X |
| 3,622,382 | 11/1971 | Brack et al. .................... | 29/576 B X |
| 3,897,274 | 7/1975 | Stehlin et al. .................. | 148/1.5 |
| 3,902,188 | 8/1975 | Jacobson ........................ | 357/59 X |
| 4,062,707 | 12/1977 | Mochizuki et al. ............ | 427/86 X |
| 4,071,945 | 2/1978 | Karatsjuka et al. .......... | 29/576 B X |
| 4,074,304 | 2/1978 | Shiba .............................. | 148/175 X |
| 4,084,986 | 4/1978 | Aoki et al. ...................... | 148/187 X |
| 4,085,499 | 4/1978 | Kuninobu et al. .............. | 29/571 |
| 4,146,413 | 3/1979 | Yonezawa et al. ............ | 427/86 X |
| 4,208,781 | 6/1980 | Rao et al. ...................... | 29/576 B X |
| 4,266,985 | 5/1981 | Ito et al. ........................ | 29/571 X |

FOREIGN PATENT DOCUMENTS 51-141572 12/1976 Japan .

*Primary Examiner*—L. Dewayne Rutledge
*Assistant Examiner*—David A. Hey
*Attorney, Agent, or Firm*—Finnegan, Henderson, Farabow, Garrett & Dunner

[57] ABSTRACT

A method for manufacturing a semiconductor device includes a step, after forming a polycrystalline silicon layer, of doping oxygen and/or nitrogen by ion implantation in a predetermined portion of the polycrystalline silicon layer and converting the predetermined portion into a resistive element. The polycrystalline silicon layer is formed to cover a contact hole which exposes a predetermined portion of a conductive region, that is, a doped or semiconductor region or a wiring layer formed in contact with a semiconductor body. Within this contact hole and within the region of the polycrystalline silicon layer which is in contact with the doped region or the wiring layer, the polycrystalline silicon layer is converted into the resistive element by ion implantation.

20 Claims, 17 Drawing Figures

METHOD FOR MANUFACTURING A SEMICONDUCTOR DEVICE

BACKGROUND OF THE INVENTION

1. Field of the Invention

The present invention relates to a method for manufacturing a semiconductor device and, more particularly, to a method for manufacturing a semiconductor device utilizing a polycrystalline silicon layer as a resistive element.

2. Description of the Prior Art

As a semiconductor device which utilizes a polycrystalline silicon layer as a resistive element, a device as schematically shown in FIG. 1 is known. This device is manufactured by a method which includes a step of forming an insulating layer 12 on a semiconductor substrate 11 and forming a polycrystalline silicon layer 13 doped with a small amount of an impurity and thus having a high resistance. A predetermined portion of the polycrystalline silicon layer 13 is covered with a mask 14, and an impurity is doped to a high concentration through the exposed portion by thermal diffusion, so that parts 15, 15 of the polycrystalline silicon layer 13 are converted to electrically conductive layers. The undiffused portion is used as a resistive element. The semiconductor device is completed after undergoing the processes of formation and melting of a passivation layer, metallization, sintering and so on.

However, when an attempt is made to obtain a resistive element of length l with such a conventional method, the impurity formation of the conductive layers 15, 15 by thermal diffusion also diffuses in the lateral direction to reach beneath the mask 14, since the diffusion coefficient of the impurity in the polycrystalline silicon layer is much greater than in the bulk silicon. For example, when thermal diffusion is performed at 1,000° C. for 30 minutes using phosphorus as an impurity, the diffusion reaches 5μ inside the end of the mask 14; when arsenic is used as an impurity, it reaches 3μ inside the end of the mask. Therefore, for obtaining a resistive element of length l, the mask must be of length l plus twice the lateral diffusion length, thereby obstructing ultrafine processing. Further, the distribution of the impurity is changed by the subsequent heat treatment required in the following process, so that such changes must be considered in the initial design of the mask 14 for processing with high precision.

In addition, with the conventional method, the resistance of the resistive element cannot be made large enough. As is well known, the conductive mechanism of polycrystalline silicon changes with the grain boundary characteristics of the adjacent crystal grains. Control of the resistance is difficult since these grain boundary characteristics are dependent on the growing conditions of the polycrystalline silicon, on the doping conditions and on the heat treatment conditions when an impurity is doped for obtaining high resistivity. Moreover, since the amount of the impurity to be doped is very small for higher resistivity, the resistivity changes abruptly relative to the doping concentration so that the control of the resistivity is even more difficult. Especially when the impurity is doped simultaneously with the growth of the polycrystalline silicon layer, that is, when the polycrystalline silicon layer is grown in the atmosphere containing the impurity, the resistivity becomes simultaneously dependent on the amount of the impurity and the growing conditions of the polycrystalline silicon layer. Thus, the sheet resistivity obtainable with good precision with the polycrystalline silicon layer produced by the conventional method has been limited to 1 MΩ/□ at maximum.

When the resistance of the resistive element is thus small and a semiconductor device with such a resistive element is applied to, for example, load elements of a MOS static memory device of large capacity, the power consumption of the memory device becomes very large so that the device is virtually inoperable. If the length l of the resistive element is made large for avoiding this, the device must be made larger in size.

SUMMARY OF THE INVENTION

It is, therefore, one object of the present invention to provide a method for manufacturing a semiconductor device according to which a resistive element may be formed with good precision from a polycrystalline silicon layer.

It is another object of the present invention to provide a method for manufacturing a semiconductor device according to which it is easy to form a resistive element of controlled high resistivity from a polycrystalline silicon layer.

It is still another object of the present invention to provide a method for manufacturing a semiconductor device according to which the ultrafine processing is facilitated.

Broadly defined, the present invention provides a method for manufacturing a semiconductor device which includes a step, after forming a polycrystalline silicon layer, of doping oxygen and/or nitrogen by ion implantation in a predetermined portion of the polycrystalline silicon layer to convert said predetermined portion into a resistive element. The polycrystalline silicon layer is so formed as to cover a contact hole which exposes a predetermined portion of a conductive region, i.e., a doped or semiconductor region or a wiring layer formed in contact with a semiconductor body including a substrate. Within this contact hole and within the region of the polycrystalline silicon layer portion in contact with said diffused region or said wiring layer, said polycrystalline silicon layer is converted into a resistive element by said ion implantation. Thus, the resistive element constitutes a buried contact.

DETAILED DESCRIPTION OF THE PREFERRED EMBODIMENTS

The present invention will now be described in detail with reference to the accompanying drawings.

Figure 1:
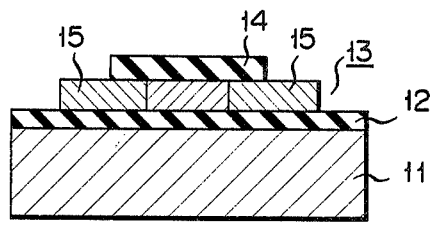
FIG. 1 is a sectional view of a semiconductor device having a resistive element manufactured by the conventional method.
Figure 2A:
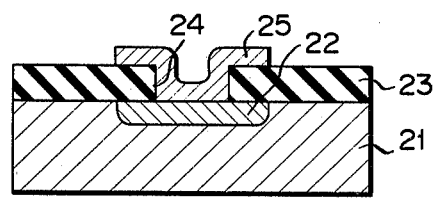
FIGS. 2A–2D are sectional views illustrating the steps in sequential order of a method for manufacturing a semiconductor device according to an embodiment of the present invention.

As shown in FIG. 2A, an n-type impurity, for example, phosphorus is diffused at a concentration of about $10^{20}/cm^3$ in a semiconductor substrate, for example, a p-type silicon substrate 21, by a general method for forming a predetermined diffused region 22. A silicon oxide film 23 is formed over the entire major surface of the semiconductor substrate 21, and a contact hole 24 is formed in the silicon oxide film 23 so as to expose part of the surface of the diffused region 22. The formation of the diffused region 22 may alternatively be performed by doping an impurity through the contact hole 24.

A polycrystalline silicon layer is grown over the entire surface of the structure obtained as above with such a high impurity concentration that it may have a sufficiently low resistivity for functioning as a wiring layer. The polycrystalline silicon layer is formed, for example, by the chemical vapor deposition (CVD) at a phosphorus concentration of, for example, $10^{21}/cm^3$ and to a thickness of 5,000 Å. The highly doped polycrystalline silicon layer is so patterned that it covers the contact hole 24 and extends over the silicon oxide film 23, providing a highly doped polycrystalline silicon layer 25 of a desired pattern.

Figure 2D:
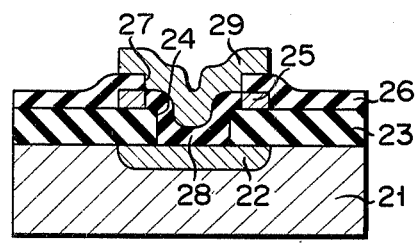
Figure 2B:
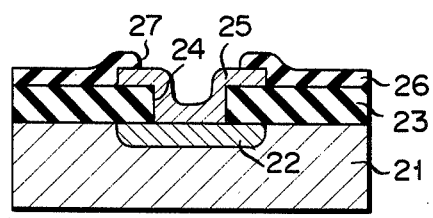
Figure 3:
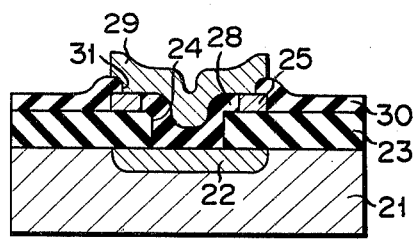
FIGS. 3–6 are sectional views illustrating different embodiments of the present invention.

Another silicon oxide film 26 is formed by the CVD method on the structure shown in FIG. 2A, and an opening 27 is formed which exposes the part of the polycrystalline silicon layer 25 over the silicon oxide film 23 and the contact hole 24, as shown in FIG. 2B.

Using the silicon oxide film 26 as a mask, oxygen, nitrogen or a mixture thereof is doped by ion implantation in the polycrystalline silicon layer. The doped region becomes amorphous, and becomes $SiO_x$ ($x \leq 2$) by the following heat treatment when oxygen is doped; it becomes $Si_3N_y$ ($y \leq 4$) when nitrogen is doped, and it becomes $SiO_x + Si_3N_y$ when a mixture thereof is doped, to be converted into a resistive element 28 with high resistivity. The heat treatment may be included in the method as a separate step, although a highly resistive element is obtainable by the ion implantation alone. The heat treatment may be accomplished by a subsequent heat treatment which is necessarily included in the manufacturing processes of a semiconductor device, such as in the formation of a passivation film of phosphosilicate glass (PSG) or the like, melting of the PSG film, sintering of the aluminum wiring and so on. The resistivity of the resistive element 28 thus obtained can be theoretically raised to be substantially equal to that of silica, silicon tetranitride or a mixture thereof. When oxygen and/or nitrogen is doped at too high a concentration, it may be diffused out from the polycrystalline silicon layer to the outside by the subsequent heat treatment. In such a case, the heat treatment is performed after covering the surface of the polycrystalline silicon region with a silicon oxide layer or the like.

The amount of oxygen and/or nitrogen to be doped is on the order of $10^{12}$–$10^{18}/cm^2$, preferably $10^{14}$–$10^{18}/cm^2$, and more preferably $5 \times 10^{17}/cm^2$ for 5,000 Å thick polycrystalline silicon.

The dimensions of the resistive element 28 thus obtained are substantially the same as those of the ion implanted region. This is attributable to the following facts: in the ion implantation, ions enter directionally so that the implanted region is precisely defined by the opening 27 of the mask 26; the ion implanted layer has characteristics which are quite different from those of the polycrystalline layer before the ion implantation, so that the impurity does not play an important role in the implanted region and the impurity diffusion into the implanted region from the surrounding region does not change the resistivity markedly: and the diffusion coefficients of oxygen and nitrogen in the polycrystalline silicon layer are small (below 1/10 of that of the impurity for providing conductivity) so that they hardly diffuse out of the implanted region into the surrounding region. Since the size of the resistive element 28 can be made substantially the same as that of the contact hole 24, it may be made into a size which allows patterning of the contact hole 24, for example $2\mu\square$. In contrast with the conventional method according to which a mask of $6\mu$ was required for obtaining a resistive element of $2\mu$, the present invention is capable of providing extremely small devices.

Further, unlike the case of the conventional method, the resistivity of the resistive element can be controlled with good precision independently of either the growing conditions of the polycrystalline silicon layer or the amount of the impurity for providing conductivity. This is due to the fact that, in accordance with the present invention, after forming a polycrystalline silicon layer which is doped or not doped with an impurity, oxygen and/or nitrogen is doped in a predetermined region of the polycrystalline silicon layer by ion implantation for raising the resistivity of this predetermined region. Especially high resistivity can be obtained when a polycrystalline silicon layer which is not doped with impurities such as boron, phosphorus and arsenic is used.

After thus forming the resistive element 28, an aluminum wiring layer 29 is formed covering the opening 27 of the silicon oxide film 26 and its surrounding region (FIG. 2D). Thus, the resistive element 28 is located between the diffused region 22 and the electrode wiring layer 29 so that the length of the resistive element 28 is defined by the film thickness of the polycrystalline silicon layer 25. Therefore, the length of the resistive element 28 can be controlled within an error of ±5% of the film thickness of the polycrystalline silicon layer 25.

FIGS. 3–6 show the structures of other embodiments of the semiconductor device manufactured by the present invention. In the structure shown in FIG. 3, the aluminum wiring layer 29 is in contact with part of a polycrystalline silicon layer region which is not ion implanted. Such a structure is obtainable by ion implanting as in the above embodiment, removing the silicon oxide film 26 used as a mask, forming another silicon oxide film 30, forming an opening 31 in the silicon oxide film 30 for exposing part of the polycrystalline silicon layer, and forming the aluminum wiring layer 29.

Figure 4:
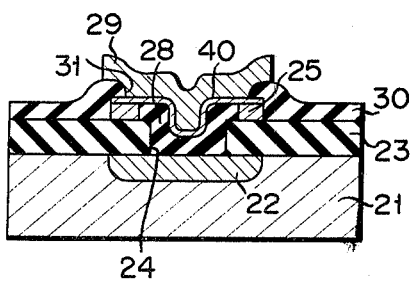

In the structure shown in FIG. 4, a low resistivity polycrystalline silicon layer 40 is formed on the surface of the polycrystalline silicon layer 25 which includes the surface of the resistive element 28. In other words, the low resistivity polycrystalline silicon layer is interposed between the aluminum wiring layer 29 and the resistive element 28. Thus current flows through the layer 40 even if good alignment of the opening 31 formed later in the silicon oxide film 30 with the contact hole 24 in the silicon oxide film 23 is not achieved so that the contact area between the aluminum electrode 29 and the resistance element 28 may be made too small. In this way, the same effects are obtained as when the aluminum electrode 29 contacts the entire surface of the resistive element 28.

Figure 5:
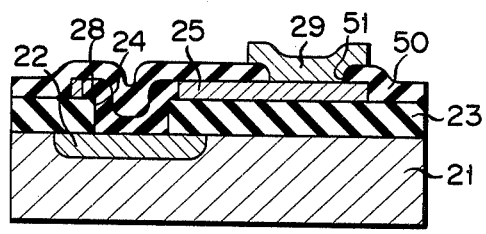

In the structure shown in FIG. 5, the resistive element 28 is covered with a silicon oxide film 50, and the aluminum electrode 29 is directly connected to a non-ion implanted region 25 of the polycrystalline silicon layer. Thus, the resistive element 28 is connected through the non-ion implanted region 25 to the electrode 29. Such a structure is obtainable by following the procedure described with reference to FIG. 2 until the formation of the resistive element 28, forming another silicon oxide film 50 on the surface of the obtained structure, forming an opening 51 in the silicon oxide film 50 for exposing part of the non-ion implanted region 25, and disposing the electrode 29 inside the opening 51. With such a structure, contact between the electrode 29 and the lower layer becomes easier, and diffusion of the implanted oxygen and/or nitrogen to the outside, which might otherwise occur during the heat treatment to follow, is prevented since the resistive element 28 is covered by the silicon oxide film 50.

Figure 6:
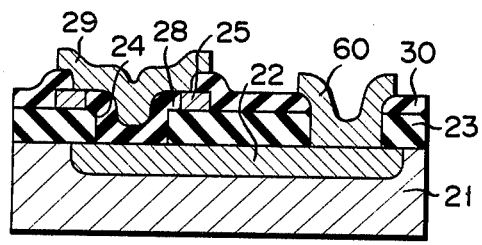

In the structure shown in FIG. 6, the resistive element 28 is connected at its top surface to the electrode 29 and at its lower surface to another aluminum electrode 60 through the diffused region 22.

Figure 7A:
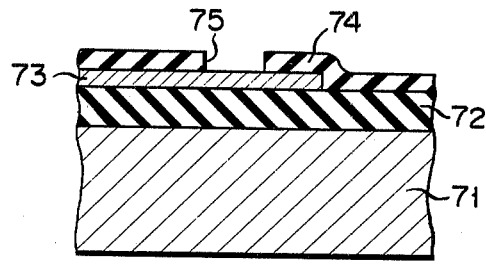
FIGS. 7A–7C and FIGS. 8A–8D are sectional views illustrating the steps in sequential order of a method for manufacturing a semiconductor device according to still different embodiments of the present invention.

The contact hole which is formed in accordance with the present invention for providing a space for forming a resistive element need not necessarily be formed on the diffused region, but may be formed on the wiring layer. For example, as shown in FIG. 7A, a first low resistivity polycrystalline silicon layer 73 may be formed as a wiring layer on a silicon oxide film 72 which, in turn, is formed on a semiconductor substrate 71; a second silicon oxide film 74 is formed over the entire surface of the structure thus obtained, and a contact hole 75 is formed in the second silicon oxide film 74 for exposing part of the polycrystalline silicon layer 73.

Figure 7B:
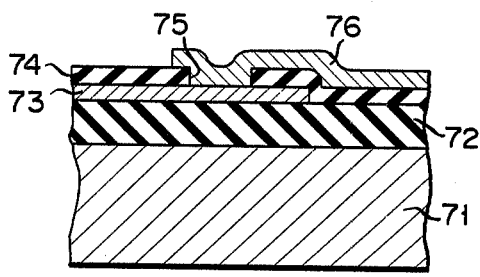

Then, as shown in FIG. 7B, a second low resistivity polycrystalline silicon layer 76 is formed to cover the contact hole 75 and its surrounding region.

Figure 2C:
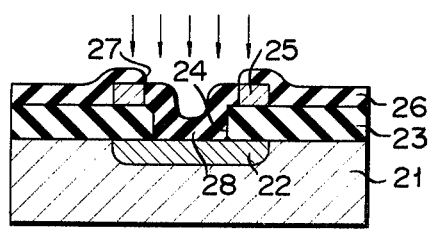
Figure 7C:
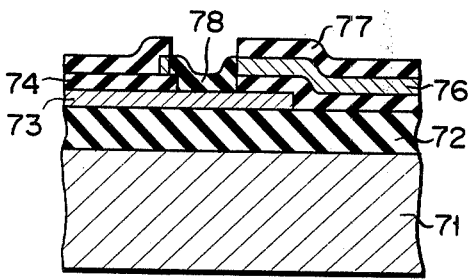

Finally, as shown in FIG. 7C, a mask 77 is formed by the method described with reference to FIGS. 2B and 2C, and a predetermined portion of the polycrystalline silicon layer 76 is made to have a higher resistivity by ion implantation of oxygen and/or nitrogen for converting it into a resistive element 78.

Figure 8A:
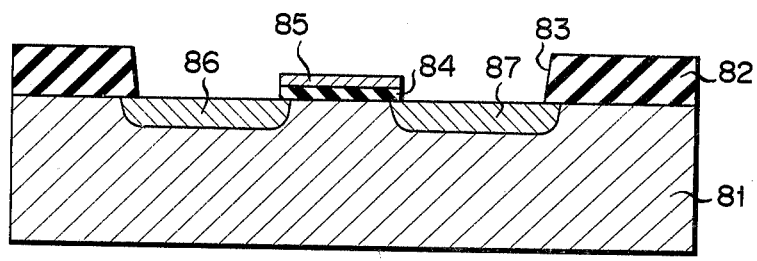

FIGS. 8A–8D show a method for manufacturing a combination of a resistive element with a silicon gate MOS transistor. As shown in FIG. 8A, a field silicon oxide film 82 is formed on a p-type semiconductor substrate 81 and is provided with a large opening 83 to expose the surface of the substrate 81. A thin silicon oxide film is formed on the exposed surface of the substrate 81 and a polycrystalline layer is formed on the thin oxide film. Then, predetermined portions of the polycrystalline layer and the thin oxide film are removed in a single etching step or separate etching steps to provide a gate oxide film 84 and a polycrystalline gate layer 85. An impurity such as phosphorus is doped by diffusion or ion implantation using the gate layer 85 as a mask to form two $n^+$-type regions, that is, a source region 86 and a drain region 87 in the substrate 81. Thus, the gate oxide film 84 is positioned on the substrate 81 between the source region 86 and the drain region 87.

Figure 8B:
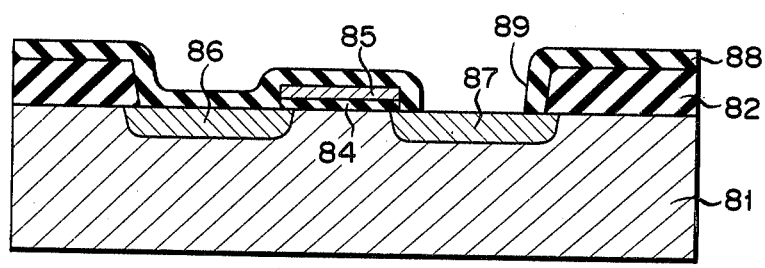

A silicon oxide film 88 is formed by CVD method on the entire surface of the structure of FIG. 8A and is provided with a contact hole 89 to partially expose the surface of the drain region 87 as shown in FIG. 8B.

Figure 8C:
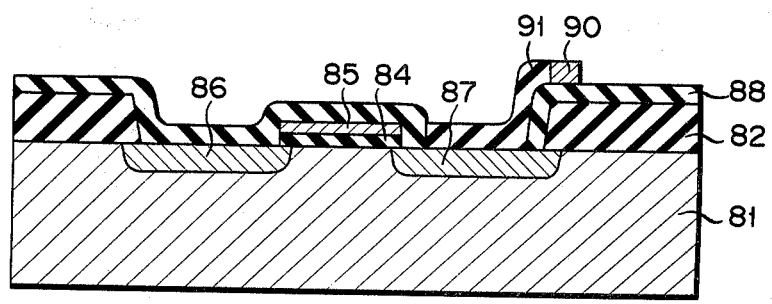

A low resistivity polycrystalline silicon layer 90 is formed as has been described to cover the contact hole 89. Using a mask (not shown), a predetermined portion of the polycrystalline silicon layer 90 is converted into a resistive element 91 in accordance with the method of the present invention, as shown in FIG. 8C.

After removing the mask, another silicon oxide film 92 is formed. The openings 93, 94 and 95 are formed in the silicon oxide film 92 and the silicon film 82 thereunder to partially expose the surfaces of the resistive element 91, the source region 86, and the polycrystalline silicon gate layer 85. Aluminum electrodes 96, 97 and 98 are formed in the openings 93, 94 and 95, respectively (FIG. 8D).

Figure 8D:
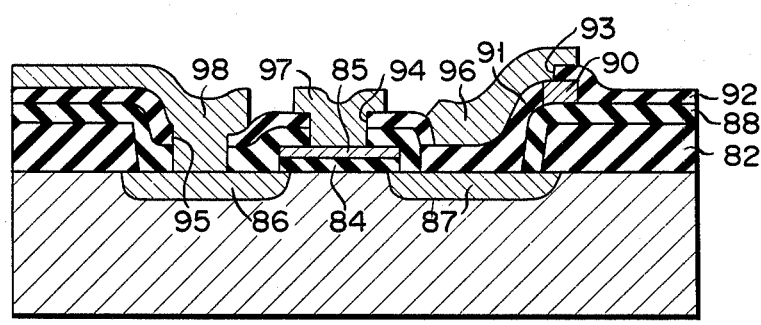
Figure 9:
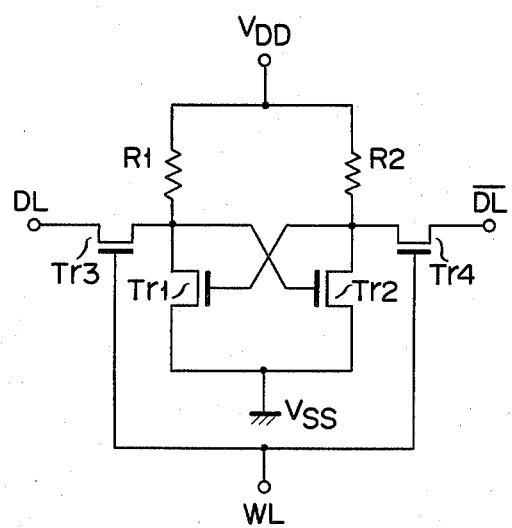
FIG. 9 is a circuit diagram of a flip-flop including the semiconductor device shown in FIG. 8D.

FIG. 9 shows a flip-flop memory cell of static operating type which has as its constituent unit a device consisting of the transistor with the resistive element shown in FIG. 8D. In the figure, symbols $Tr_1$–$Tr_4$ denote transistors. Among these, $Tr_3$ and $Tr_4$ are switching transistors which activate bit lines DL, DL and the memory cell in response to a pulse from a word line WL. Resistors $R_1$ and $R_2$ provide load resistors for the respective transistors $Tr_1$ and $Tr_2$ for forming current paths from a power source terminal $V_{DD}$ to a terminal $V_{SS}$ for maintaining bistable condition. Since $Tr_1$ and $R_1$, and $Tr_2$ and $R_2$ are fabricated as shown in FIG. 8D, they may be packed with high density. Further, since a high resistance may be obtained with $R_1$ and $R_2$, a lower power consumption may be attained.

For example, with a conventional resistive element, when $R_1$ and $R_2$ provide a maximum resistance of 1 $M\Omega$, the current consumption per cell is about 5 $\mu A$, and the current consumption of the entire memory array of a RAM of 64K bits is about 330 mA. In contrast with this, in accordance with the present invention, the current consumption is only 33 $\mu A$ when a load resistor element of $10^5$ $M\Omega$ is used in the embodiment. This proves the advantageous characteristics of the method of the present invention for manufacturing memory devices of greater capacity.

What is claimed is:

1. A method for manufacturing a semiconductor device comprising:
  (a) forming a semiconductor region in a major surface of a semiconductor body;
  (b) forming a first insulating film on the major surface of said semiconductor body;
  (c) forming a contact hole in said first insulating film, exposing a part of said semiconductor region;
  (d) covering said contact hole with a polycrystalline silicon layer having a portion in said contact hole which contacts said part of said semiconductor region and having a portion extending on said insulating film around said contact hole; and
  (e) ion implantation of at least one element selected from the group consisting of oxygen and nitrogen in part of said polycrystalline silicon layer, said part including the portion in contact with said semiconductor region to convert said part into a resistive element.

2. The method as recited in claim 1, including, before said ion implantation, the step of forming a second insulating film on said first insulating film and on the peripheral portion of said polycrystalline layer, said second insulating film having a hole exposing said part of said polycrystalline silicon layer, and said peripheral portion of said polycrystalline silicon layer remaining as a non-ion implanted region after said ion implantation.

3. The method as recited in claim 2, comprising forming an electrode on said resistive element.

4. The method as recited in claim 2, further comprising removing said second insulating film after said ion implantation, and forming an electrode on said resistive element, said electrode contacting said non-ion implanted region.

5. The method as recited in claim 4, further comprising forming a second low resistivity polycrystalline silicon layer covering said resistive element and said non-ion implanted region, before the formation of said electrode.

6. The method as recited in claim 4, further comprising forming a second electrode which is connected to said semiconductor region and is isolated from said electrode and which is connected through said semiconductor region to said resistive element.

7. The method as recited in any one of claims 1 to 6, wherein an impurity is doped in said polycrystalline silicon layer at such a high concentration that said polycrystalline silicon layer has a sufficiently low electrical resistivity that it can function as a wiring layer.

8. The method as recited in claim 7, wherein said ions are implanted in an amount on the order of $10^{12}$–$10^{18}$/cm$^2$.

9. The method as recited in claim 7 wherein said ions are implanted in an amount on the order of $10^{14}$–$10^{18}$/cm$^2$.

10. A method for manufacturing a semiconductor device comprising:
(a) forming a first low resistivity polycrystalline silicon layer as a wiring layer on a first insulating film formed on a semiconductor body;
(b) forming a second insulating film covering said wiring layer and said first insulating film;
(c) forming a contact hole in said second insulating film, exposing part of said wiring layer;
(d) covering said contact hole with a second low resistivity polycrystalline silicon layer having a portion in said contact hole which contacts said part of said wiring layer and having a portion extending on said second insulating film around said contact hole; and
(e) ion implantation of at least one element selected from the group consisting of oxygen and nitrogen in part of said polycrystalline silicon layer, said part including the portion in contact with said wiring layer to convert said part into a resistive element.

11. The method as recited in claim 10 wherein an impurity is doped in said second polycrystalline silicon layer at such a high concentration that said polycrystalline silicon layer has a sufficient low electrical resistivity that it can function as a wiring layer.

12. The method as recited in claim 10 or 11, wherein said ions are implanted in an amount in the order of $10^{12}$–$10^{18}$/cm$^2$.

13. The method as recited in claim 10 or 11, wherein said ions are implanted in an amount on the order of $10^{14}$–$10^{18}$/cm$^2$.

14. A method for manufacturing a semiconductor device comprising:
(a) forming a source region and a drain region in a semiconductor substrate;
(b) forming a gate oxide film on said substrate between said source and drain regions;
(c) forming a gate layer of polycrystalline silicon on said gate oxide film;
(d) forming a first silicon oxide film covering said substrate surface and said gate layer;
(e) forming a contact hole in said first silicon oxide film, exposing part of said drain region;
(f) covering said contact hole with a low resistivity polycrystalline silicon layer having a portion in said contact hole which contacts said part of said drain region and having a portion extending on said first silicon oxide film around said contact hole;
(g) ion implanting at least one element selected from the group consisting of oxygen and nitrogen in part of said polycrystalline silicon layer, said part including the portion in contact with said drain region to convert said part into a resistive element; and
(h) forming electrode layers which are in contact with said source region, said gate layer and said resistive element.

15. The method as recited in claim 14, comprising before said ion implantation, the step of forming a second insulating film on said first insulating film and on the peripheral portion on of said low resistivity polycrystalline silicon layer, said second insulating film having a hole exposing said part of said low resistivity polycrystalline silicon layer, and said peripheral portion of said low resistivity polycrystalline silicon layer remaining as a non-ion implanted region after said ion implantation.

16. The method as recited in claim 15, wherein said second insulating film is removed after said ion implantation and the drain electrode is formed on said resistive element, said drain electrode contacting said non-ion implanted region.

17. The method as recited in claim 16, comprising forming a second low resistivity polycrystalline silicon layer covering said resistive element and said non-ion implanted region, before the formation of said drain electrode.

18. The method as recited in any one of claims 14-17, wherein an impurity is doped in said polycrystalline silicon layer at such a high concentration that said polycrystalline silicon layer has a sufficiently low electrical resistivity that it can function as a wiring layer.

19. The method as recited in claim 18, wherein said ions are implanted in an amount on the order $10^{12}$–$10^{18}$/cm$^2$.

20. The method as recited in claim 18 wherein said ions are implanted in an amount on the order of $10^{14}$–$10^{18}$/cm$^2$.

* * * * *